United States Patent
Lin et al.

(10) Patent No.: US 10,638,610 B1
(45) Date of Patent: Apr. 28, 2020

(54) MEMORY LAYOUT FOR ABSORBING AND REDUCING REFLECTION SIGNALS

(71) Applicant: EOREX CORPORATION, Hsinchu County (TW)

(72) Inventors: Cheng-Lung Lin, Hsinchu County (TW); Wan-Tung Liang, Hsinchu County (TW)

(73) Assignee: EOREX CORPORATION, Hsinchu County (TW)

( * ) Notice: Subject to any disclaimer, the term of this patent is extended or adjusted under 35 U.S.C. 154(b) by 0 days.

(21) Appl. No.: 16/253,603

(22) Filed: Jan. 22, 2019

(51) Int. Cl.
*H05K 7/00* (2006.01)
*H05K 1/18* (2006.01)
*H05K 1/11* (2006.01)
*H05K 1/02* (2006.01)

(52) U.S. Cl.
CPC .......... *H05K 1/181* (2013.01); *H05K 1/0243* (2013.01); *H05K 1/115* (2013.01); *H05K 2201/10159* (2013.01)

(58) Field of Classification Search
CPC ...... H05K 1/181; H05K 1/0243; H05K 1/115; H05K 2201/10159
See application file for complete search history.

(56) References Cited

U.S. PATENT DOCUMENTS

| | | | | |
|---|---|---|---|---|
| 2006/0006516 A1* | 1/2006 | Funaba | ..................... | G11C 5/04 257/686 |
| 2011/0010575 A1* | 1/2011 | Ware | ................... | G06F 13/1689 713/500 |
| 2011/0317372 A1* | 12/2011 | Nomoto | .................... | G11C 5/04 361/729 |
| 2012/0002389 A1* | 1/2012 | Lee | ......................... | H05K 3/222 361/803 |
| 2014/0192582 A1* | 7/2014 | Lin | .......................... | G11C 5/06 365/63 |
| 2015/0055392 A1* | 2/2015 | Lin | .......................... | G11C 5/06 365/63 |
| 2017/0206958 A1* | 7/2017 | He | ......................... | G11C 19/28 |

* cited by examiner

*Primary Examiner* — Yuriy Semenenko
(74) *Attorney, Agent, or Firm* — Jackson IPG PLLC; Demian K. Jackson

(57) ABSTRACT

A memory layout is provided. The layout comprises a circuit board, a plurality of memories, a processing unit, and a reflection absorption unit. The circuit board has a first surface and a second surface. The first surface is set with a first wire unit and a second wire unit corresponding to each other. The memories are separately set on the first and second surfaces of the circuit board and connect to the first and second wire units. The processing unit connects to the first wire unit. The reflection absorption unit connects to the second wire unit. Thus, not only the capacity of the memories is increased, but also, during operating the memories, related reflection signals are absorbed by the reflection absorption unit for stably operating the memories with operation velocity enhanced as well.

9 Claims, 4 Drawing Sheets

MEMORY LAYOUT FOR ABSORBING AND REDUCING REFLECTION SIGNALS

TECHNICAL FIELD OF THE INVENTION

The present invention relates to a memory layout; more particularly, to absorbing and reducing reflection signals for enhancing memory capacity with memory operation stabilized.

DESCRIPTION OF THE RELATED ARTS

A conventional memory device typically comprises a processor, a few memories connected to the processor, and a signal reflector set at a front end of the memories connected in parallel.

However, in terms of the above-described device, the transmission time of reflection signals is still not effectively reduced, which would seriously affect the overall operation of the device. Moreover, when multiple conventional memories want to be integrated (e.g.: integrating 32-bit memories into 64-bit ones), at least two chips are inter-connected. A plurality of address areas and control areas of the two chips are inter-connected. Yet, it not only leads to increase the complexity of circuit layout, but also greatly increases the layer number of the layout. Nevertheless, memory capacity cannot be effectively increased.

Hence, the prior art does not fulfill all users' expectations on actual use.

SUMMARY OF THE INVENTION

The main purpose of the present invention is to not only increase the capacity of memories but also, during operating the memories, absorb related reflection signals by a reflection absorption unit, where the memories operate stably with velocity enhanced as well.

To achieve the above purposes, the present invention is a memory layout for absorbing and reducing reflection signals, comprising a circuit board, a plurality of memories, a processing unit, and a reflection absorption unit, where the circuit board has a first surface and a second surface; the first surface has a first wire unit and a second wire unit corresponding to each other; the memories are set on the first and second surfaces of the circuit board; the memories connect to the first and second wire units; the processing unit connects to the first wire unit; and the reflection absorption unit connects to the second wire unit. Accordingly, a novel memory layout for absorbing and reducing reflection signals is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
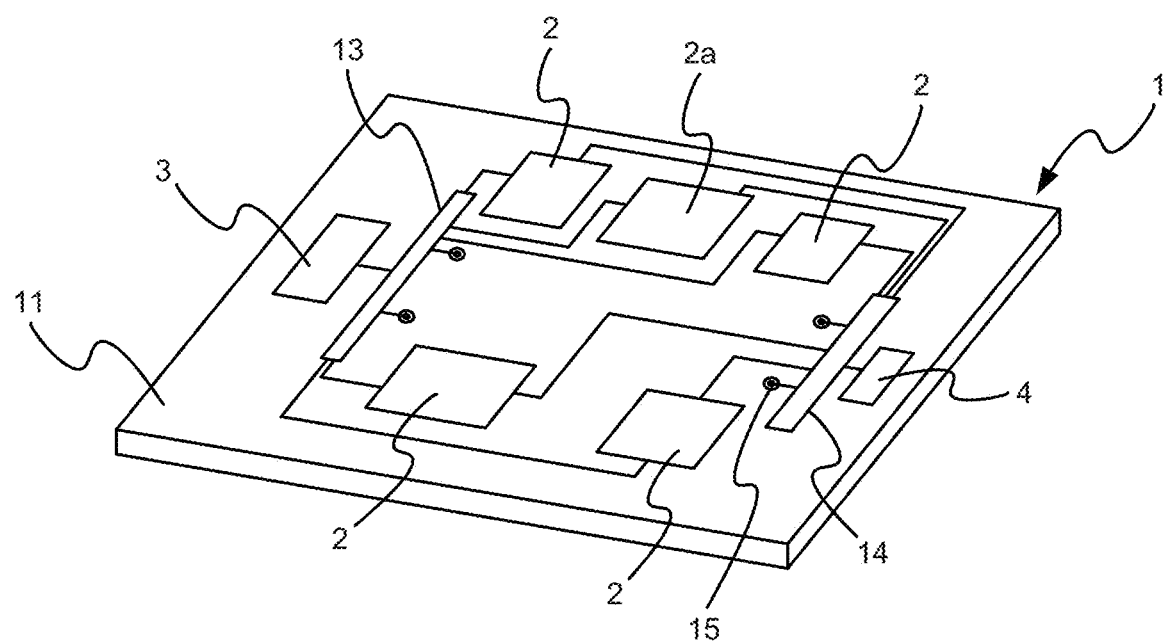
FIG. 1 is the view showing the first surface of the preferred embodiment according to the present invention.

The following description of the preferred embodiment is provided to understand the features and the structures of the present invention.

Please refer to FIG. 1 to FIG. 4, which are a view showing a first surface of a preferred embodiment according to the present invention; a view showing a second surface; a view showing a memory; and a view showing another memory. As shown in the figures, the present invention is a memory layout for absorbing and reducing reflection signals, comprising a circuit board 1, a plurality of memories 2,2a, a processing unit 3, and a reflection absorption unit 4.

The circuit board 1 has a first surface 11 and a second surface 12. Each of the first surface 11 and the second surface 12 has a first wire unit 13 and a second wire unit 14 corresponding to the first wire unit 13, separately. Therein, the first wire unit 13 has a plurality of address connection areas, instruction connection areas, and control connection areas; and the second wire unit 14 has a plurality of address, instruction, and control connection areas, correspondingly.

The memories 2,2a are set on the first and second surfaces 11,12 of the circuit board 1. The memories 2,2a on the first and second surfaces 11,12 correspondingly connect to the first and second wire units 13,14, separately.

The processing unit 3 connects to the first wire unit 13.

The reflection absorption unit 4 connects to the second wire unit 14.

On using the present invention, in the application of a related field of DRAM, NAND, NOR or SRAM using the memory layout having a circuit operated under a frequency of ten giga to ten mega hertz, the processing unit 3 is coordinated with the memories 2,2a for signal transmission while the reflection absorption unit 4 is used to absorb related reflection signals for reducing the reflection signals during the signal transmission. Thus, the memories 2,2a are operated with stability while operation velocity is enhanced as well.

In addition, since the memories 2,2a are set on the first and second surfaces 11,12 of the circuit board 1, the capacity of the memories 2,2a is greatly increased.

Figure 2:
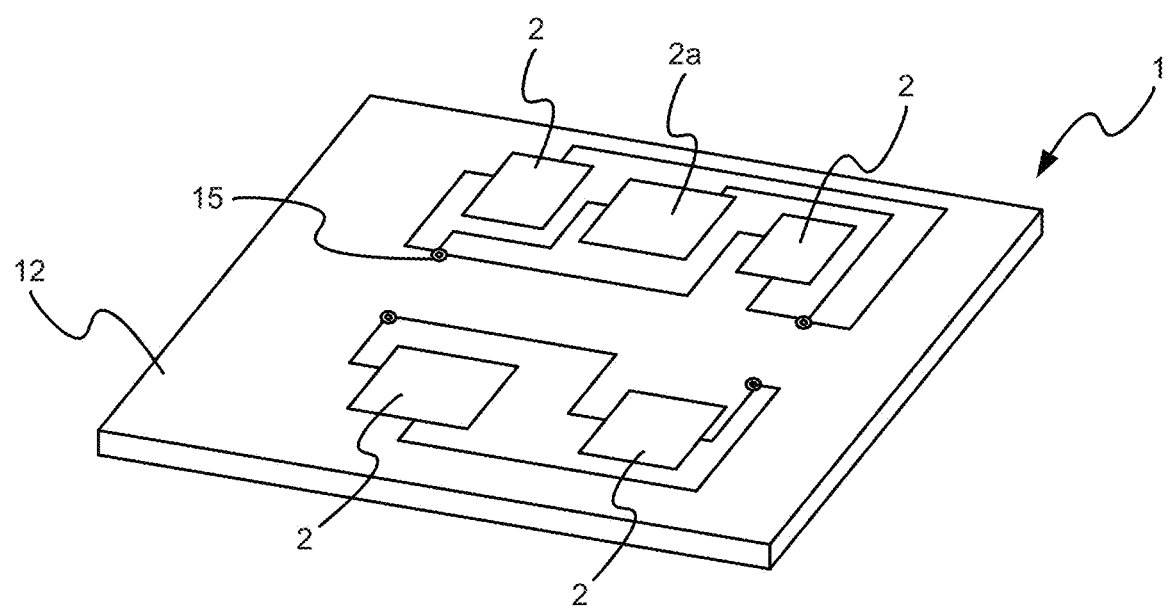
FIG. 2 is the view showing the second surface.
Figure 3:
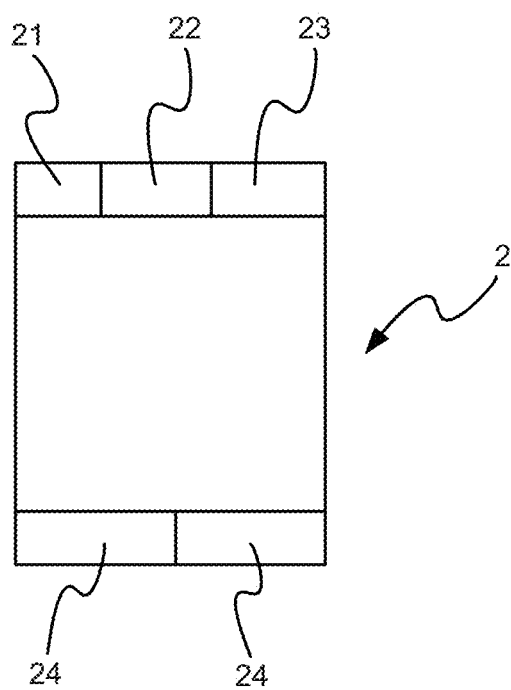
FIG. 3 is the view showing the memory.
Figure 4:
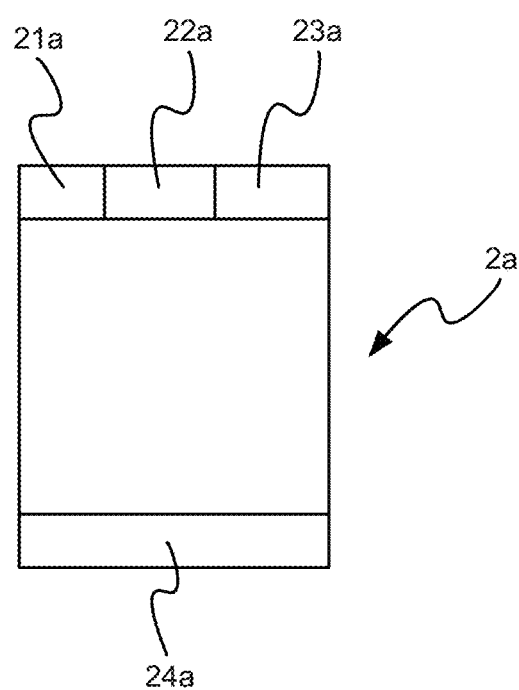
FIG. 4 is the view showing the another memory.

Each one of the memories 2,2a has at least an address pin 21,21a. an instruction pin 22,22a, and a control pin 23,23a, as shown in FIG. 3 and FIG. 4. The memories 2,2a on the first surface 11 connect to the first and second wire units 13,14 with the address, instruction, and control pins 21,21a, 22,22a,23,23a, as shown in FIG. 1. Besides, the circuit board 1 has a plurality of through-holes 15 to connect the first and second surfaces 11,12 in between. The memories 2,2a on the second surface 12 connect to the first and second wire units 13,14 with the address, instruction, and control pins 21,21a,22,22a,23,23a through the through-holes 15, as shown in FIG. 2. Consequently, the memories 2.2a on the second surface 12 are set without wiring for fabricating the memories 2.2a easily with the feasibility of capacity increase.

The memory 2 has at least two input/output (I/O) ports 24, as shown in FIG. 3, or the memory 2a has one I/O port 24a, as shown in FIG. 4. In the preferred embodiment, on each one of the first and second surfaces 11,12, four of the memories 2 are set with two I/O ports 24 and one of the memories 2a is set with one I/O port 24a. Thus, the circuit board 1 are set with a more preferable number of the memories 2,2a within a fixed size for increasing the capacity of the memories 2,2a.

The reflection absorption unit 4 is a resistor; the reflection absorption unit 4 has a resistance of 30~100 ohms; and The reflection absorption unit 4 connects to a half operating voltage. Hence, the present invention effectively absorbs related reflection signals for reducing reflection signals during signal transmission, so that the memories 2,2*a* are operated with stability while operation velocity is enhanced as well.

To sum up, the present invention is a memory layout for absorbing and reducing reflection signals, where not only the capacity of memories is increased, but also, during operating the memories, related reflection signals are absorbed by a reflection absorption unit for stably operating the memories with operation velocity enhanced as well.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A memory layout for absorbing and reducing reflection signals, comprising
   a circuit board, wherein said circuit board has a first surface and a second surface; and each one of said first surface and said second surface has a first wire unit and a second wire unit corresponding to said first wire unit, separately;
   a plurality of memories, wherein said memories are disposed on said first and second surfaces of said circuit board; and said memories on said first and second surfaces correspondingly connect to said first and second wire units, separately;
   a processing unit, wherein said processing unit connects to said first wire unit; and
   a reflection absorption unit, wherein said reflection absorption unit connects to said second wire unit.

2. The memory layout according to claim 1, wherein each one of said memories on said first and second surface has an address pin, an instruction pin, and a control pin; and connects to said first and second wire units with said address, instruction, and control pins.

3. The memory layout according to claim 2, wherein said circuit board has a plurality of through-holes to connect said first and second surfaces; and said memories on said second surface connect to said first and second wire units with said address, instruction, and control pins through said through-holes, separately.

4. The memory layout according to claim 1, wherein each one of said memories has at least two corresponding input/output (I/O) ports.

5. The memory layout according to claim 1, wherein each one of said memories has one I/O port.

6. The memory layout according to claim 1, wherein said reflection absorption unit is a resistor.

7. The memory layout according to claim 6, wherein said reflection absorption unit has a resistance of 30~100 ohms.

8. The memory layout according to claim 1, wherein said reflection absorption unit connects to ½ operating voltage.

9. The memory layout according to claim 1, wherein the memory layout has a circuit operated under a frequency of 10 giga to 10 mega hertz.

* * * * *